(12) United States Patent
Mäkelä et al.

(10) Patent No.: US 7,302,529 B2
(45) Date of Patent: Nov. 27, 2007

(54) METHOD FOR COMPARING CONTENTS OF MEMORY COMPONENTS

(75) Inventors: Jakke Mäkelä, Turku (FI); Jukka-Pekka Vihmalo, Tampere (FI); Marko T. Ahvenainen, Ruutana (FI)

(73) Assignee: Nokia Corporation, Espoo (FI)

( * ) Notice: Subject to any disclaimer, the term of this patent is extended or adjusted under 35 U.S.C. 154(b) by 323 days.

(21) Appl. No.: 10/747,779

(22) Filed: Dec. 29, 2003

(65) Prior Publication Data

US 2005/0007838 A1 Jan. 13, 2005

(30) Foreign Application Priority Data

Dec. 31, 2002 (FI) .................................. 20022297

(51) Int. Cl.
*G06F 12/00* (2006.01)

(52) U.S. Cl. ...................................... 711/141; 711/151

(58) Field of Classification Search ................ 711/141, 711/151
See application file for complete search history.

(56) References Cited

U.S. PATENT DOCUMENTS

| | | |
|---|---|---|
| 5,193,093 A | 3/1993 | Okazaki ....................... 371/34 |
| 5,404,485 A | 4/1995 | Ban ............................ 711/202 |
| 5,581,726 A | 12/1996 | Tanaka |
| 5,634,109 A | 5/1997 | Chen et al. .................. 395/470 |
| 5,732,238 A | 3/1998 | Sarkozy ....................... 395/440 |
| 5,765,172 A * | 6/1998 | Fox ............................. 707/204 |
| 6,141,784 A | 10/2000 | Davis et al. ................. 714/748 |
| 6,944,623 B2 * | 9/2005 | Kim ............................ 707/102 |

FOREIGN PATENT DOCUMENTS

| | | |
|---|---|---|
| EP | 0 667 579 A1 | 8/1995 |
| WO | WO 99/17200 | 4/1999 |
| WO | WO 01/38990 A1 | 5/2001 |

* cited by examiner

*Primary Examiner*—Reba I. Elmore
(74) *Attorney, Agent, or Firm*—Hollingsworth & Funk, LLC (57) ABSTRACT

A method, system, device and software product for comparing the contents of memory components in electronic devices. A data transmission connection is established between the electronic devices, and device identifiers and checksum values are determined in the electronic devices. An initialization message is transmitted from a first electronic device to a second electronic device, the message comprising a device identifier and a checksum value. The device identifiers of the first and a second electronic device and the check-sum values are compared with each other, as a result of which the contents of the memory components are caused to correspond to each other, or the contents of the memory components are noted to correspond to each other.

18 Claims, 4 Drawing Sheets

METHOD FOR COMPARING CONTENTS OF MEMORY COMPONENTS

FIELD OF THE INVENTION

The invention relates to memory components, and particularly to comparing contents of memory components.

BACKGROUND OF THE INVENTION

More and more versatile and demanding user applications are designed for electronic devices nowadays. A mobile station, for instance, is no longer used merely for speaking, but also as a camera, a calendar, an Internet browser or a game device, for example. Such numerous new multimedia and other applications require improved performance, and particularly greater memory capacity and lower energy consumption.

The memory components in electronic devices are significant for the performance and energy consumption of the whole electronic device. The problem in DRAM memory components (Dynamic Random Access Memory) according to the prior art is particularly their great energy consumption, which is at least partly due to the refresh functionality of the DRAM memory circuit, i.e. recharging the capacitor periodically. The problem in SRAM memory components (Static Random Access Memory) is, in turn, their large physical size and high price. Integrating memory components according to the prior art into portable electronic devices, such as mobile stations, is thus difficult due to the great energy consumption and physical size of the memory components. In addition, problems are caused by disappearance of the data stored in DRAM and SRAM memory components when the power supply stops, synchronization between different memory components and corruption of files and file systems.

With the solution known from U.S. Pat. No. 5,404,485 (Ban), data can be written continuously in such physical memory locations of a memory component in which nothing has been written yet. The problem in this solution is, however, that the contents of the memory component are not checked in any way, but the method only concentrates on studying the state of the memory component, in other words whether something has been written in the memory component or whether the contents of the memory component have been cleared, for example.

BRIEF DESCRIPTION OF THE INVENTION

An object of the invention is thus to provide a method and an apparatus implementing the method in such a way that disadvantages of the above-mentioned problems can be reduced. The object of the invention is achieved with a method, system, device and software that are characterized in what is stated in the independent claims. Preferred embodiments of the invention are described in the dependent claims.

The invention is based on comparing the contents of memory components NVC(A) and NVC(B) in a first and a second electronic device A and B as follows. A data transmission connection, for example a wireless data transmission connection WL, is established between the first and the second electronic device A and B, after which device identifiers ID(A) and ID(B), first checksum values $CS_1(A)$ and $CS_1(B)$ relating to an earlier data transmission event and second checksum values $CS_2(A)$ and $CS_2(B)$ relating to a second data transmission event are determined in the first and the second electronic device A and B. An initialization message INIT is transmitted from the first electronic device A to the second electronic device B, the message comprising at least the first device identifier ID(A) and the first and the second checksum value $CS_1(A)$ and $CS_2(A)$, or information for determining them. The device identifiers ID(A), ID(B), the first checksum values $CS_1(A)$, $CS_1(B)$ and the second checksum values $CS_2(A)$, $CS_2(B)$ of the first and the second electronic device A and B are compared with each other, and consequently, if the device identifiers ID(A), ID(B), the first checksum values $CS_1(A)$, $CS_1(B)$ and the second checksum values $CS_2(A)$, $CS_2(B)$ do not correspond to each other, the contents of the memory components NVC(A) and NVC(B) are caused to correspond to each other, or if the device identifiers ID(A), ID(B), the first checksum values $CS_1(A)$, $CS_1(B)$ and the second checksum values $CS_2(A)$, $CS_2(B)$ do correspond to each other, the contents of the memory components NVC(A), NVC(B) are noted to correspond to each other.

According to a preferred embodiment of the invention, the contents of the memory components NVC(A) and NVC(B) are noted to correspond to each other if the device identifiers ID(A), ID(B), the first checksum values $CS_1(A)$, $CS_1(B)$ and the second checksum values $CS_2(A)$, $CS_2(B)$ correspond to each other.

According to a second preferred embodiment of the invention, the device identifiers ID(A) and ID(B) are included in the first and/or the second checksum value $CS_1$ and/or $CS_2$. The device identifier ID(A) of the first electronic device A is included in the first and/or the second checksum value $CS_1(A)$, $CS_2(A)$, and the device identifier ID(B) of the second electronic device B is included in the first and/or the second checksum value $CS_1(B)$, $CS_2(B)$.

According to a third preferred embodiment, the device identifier ID(B) of the second electronic device B as well as the first and the second checksum value $CS_1(B)$, $CS_2(B)$ are determined after the second electronic device B has received the initialization message INIT.

According to a fourth preferred embodiment of the invention, an acknowledgement message ACK INIT comprising the device identifier ID(B) and the first and the second checksum value $CS_1(B)$, $CS_2(B)$ or information for determining them is transmitted from the second electronic device B to the first electronic device A after the device identifier ID(B) and the first and the second checksum value $CS_1(B)$, $CS_2(B)$ have been determined.

According to a fifth preferred embodiment of the invention, the device identifiers ID(A) and ID(B) are compared with each other. Consequently, if the device identifiers ID(A) and ID(B) do not correspond to each other, the contents of the memory components NVC(A) and NVC(B) are caused to correspond to each other, or if the device identifiers ID(A) and ID(B) do correspond to each other, the first checksum values $CS_1(A)$ and $CS_1(B)$ are compared. As a result, if the first checksum values $CS_1(A)$ and $CS_1(B)$ do not correspond to each other, the contents of the memory components NVC(A) and NVC(B) are caused to correspond to each other, or if the first checksum values $CS_1(A)$ and $CS_1(B)$ do correspond to each other, the second checksum values $CS_2(A)$ and $CS_2(B)$ are compared. Consequently, the contents of the memory components NVC(A) and NVC(B) are caused to correspond to each other if the second checksum values $CS_2(A)$ and $CS_2(B)$ do not correspond to each other.

According to a sixth preferred embodiment of the invention, the first checksum values $CS_1(A)$ and $CS_1(B)$ are compared with each other, and consequently, if the first checksum values $CS_1(A)$ and $CS_1(B)$ do not correspond to each other, the contents of the memory components NVC(A) and NVC(B) are caused to correspond to each other, or if the first checksum values $CS_1(A)$ and $CS_1(B)$ do correspond to each other, the second checksum values $CS_2(A)$ and $CS_2(B)$ are compared. Consequently, the contents of the memory components NVC(A) and NVC(B) are caused to correspond to each other if the second checksum values $CS_2(A)$ and $CS_2(B)$ do not correspond to each other.

Significant advantages are achieved with the arrangement according to the invention. One advantage is that the arrangement allows robust, i.e. accurate, data transmission, whereby, for example, data transmission between memory components can be interrupted and continued later on at the same point. One of the advantages is also that data transmission rate can be increased, maintaining at the same time data robustness. Still another advantage is that data robustness is improved under shutdown conditions, because the stored data does not disappear when the power supply stops. One advantage is also that an NVRAM cache memory is usually less expensive than an SRAM cache memory, which has equally high memory capacity. A further advantage is that the energy consumption of the electronic device can be optimised. The arrangement according to the invention can thus simplify and enable the use of high-capacity mass memory technology, for instance in mobile stations.

BRIEF DESCRIPTION OF THE FIGURES

The invention will now be explained in more detail in connection with preferred embodiments, with reference to the attached drawings, of which

DETAILED DESCRIPTION OF THE INVENTION

In the following examples, the invention will be described based on wireless data transmission connections, such as Bluetooth connections, but it will not be limited to wireless data transmission connections only. In addition to wireless data transmission connections, the invention can be applied to any data transmission connections, such as fixed data transmission connections.

The memory components in electronic devices are significant for the performance of the whole electronic device, particularly for data transmission rates and energy consumption. In electronic devices, memories are usually used for storing data. Different memory types differ from each other mainly with regard to the operational rate, storing capacity and preservability of the stored data. Therefore, electronic devices generally comprise several different memories for different objects of use.

Memories can generally be divided into volatile and non-volatile memories on the basis of their operation. When the power supply is interrupted, a volatile memory generally loses all data it has stored, but a non-volatile memory typically preserves the data it has stored.

RAM memories (Random Access Memory) are usually volatile memories in which data can be written and read out when the power source is switched on. The main memory used by the central processing unit CPU of an electronic device is usually RAM memory. RAM memories can be further divided into SRAM memories (Static Random Access Memory) and DRAM memories (Dynamic Random Access Memory).

In an SRAM memory cell, the information is typically stored in a flip-flop comprising generally four to six transistors. The structure of an SRAM memory is thus complex and takes a lot of space. Owing to its fastness and low energy consumption, an SRAM memory is used particularly for executing a program code and as a cache memory.

A DRAM memory cell typically comprises one capacitor, in which data is stored as electric charge, and a MOSFET transistor (Metal Oxide Semiconductor Field Effect Transistor), which functions as a switch when the capacitor is charged and discharged. Owing to its simple structure, a DRAM memory is small in size and inexpensive. For example, millions of memory cells can be implemented for one integrated circuit. Thus, the use of one-transistor DRAM cells compared with the use of six-transistor SRAM cells saves up to millions of transistors with an integrated circuit. In order to function, however, a DRAM memory requires refresh functionality, i.e. recharging of the capacitor, periodically. Despite the refresh functionality, the DRAM memory is rapid, and it is used particularly for storing data temporarily.

A ROM memory (Read Only Memory) is typically a non-volatile read-only memory. Storing data in a ROM memory can be permanent or reprogrammable, depending on the manufacturing technology. The ROM memories can be divided into mask ROM memories, PROM memories (Programmable Read Only Memory) and EPROM memories (Erasable and Programmable Read Only Memory), for example. Mask ROM memories are programmed as early as upon manufacture; PROM memories can be programmed once by the user; and EPROM memories can be reprogrammed several times. ROM memories are fast and their power consumption is usually low. ROM memories are used particularly for mass-storing permanent data, such as for storing programs and microcodes.

RAM memories that have RAM memory read, write and clear properties but that are nevertheless non-volatile memories, are called NVRAM memories (Non-Volatile Random Access Memories). An NVRAM memory thus preserves the data it has stored although the power supply is stopped. Operation of an NVRAM memory is generally fast, and the memory is typically used as mass memories MM, for instance in mobile stations. NVRAM memories include for instance an FeRAM memory (Ferroelectric Random Access Memory), an MRAM memory (Magnetoresistive Random Access Memory) and an OUM memory (Ovonic Unified Memory).

Figure 1:
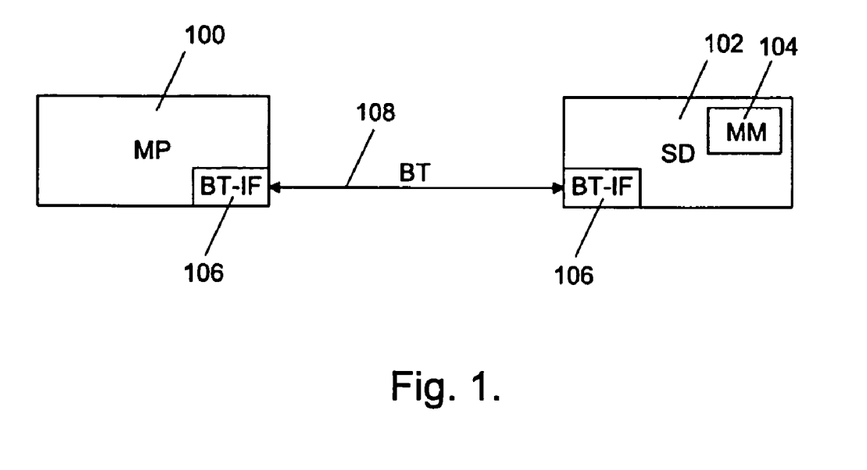
FIG. 1 shows a block diagram of a system comprising two electronic devices.

FIG. 1 shows a system in which a large mass memory MM (104) has been implemented in an electronic device, such as a mobile station (100) by functionally connecting to the mobile station (100) a second electronic device, such as a storing device SD (102), comprising a mass memory. Thus, a data transmission connection, for example a wireless Bluetooth connection BT (108), is established between the wireless interfaces, for instance Bluetooth interfaces BT-IF (106), of the electronic devices, it being possible to transfer data over the data transmission connection for instance from the mass memory of the storing data SD (102) to be used by the mobile station MP (100). The storing device SD (102) preferably has a power supply system of its own, whereby it does not load the mobile station MP (100). Once the mass memory MM (104) of the storing device SD (102) has been implemented in the mobile station MP (100), the physical size and energy consumption of the memory component is no longer a problem.

Figure 2:
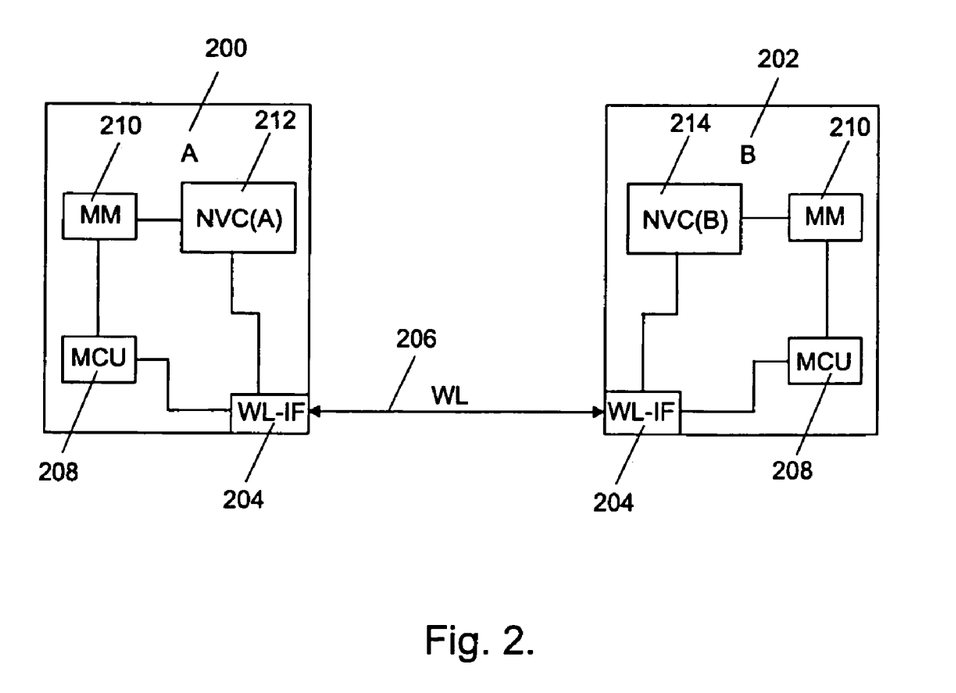
FIG. 2 shows simplified block diagrams of the structures of two electronic devices, comprising symmetrical cache memory components.

FIG. 2 shows a system in which a wireless connection WL (206), such as a Bluetooth connection, can be established between the wireless interfaces WL-IF (204), for instance Bluetooth interfaces, of two electronic devices A (200) and B (202). The electronic devices A (200) and B (202) comprise for instance a processor MCU (Micro Controller Unit) (208) arranged to determine the identifiers used for identifying the electronic devices A (200) and B (202), i.e. what are called device identifiers ID(A), ID(B), as well as first checksum values $CS_1(A)$, $CS_1(B)$ and second checksum values $CS_2(A)$, $CS_2B$, of which the first checksum values $CS_1(A)$, $CS_1(B)$ represent checksum values relating to the preceding, preferably confirmed data transmission event, and the second checksum values $CS_2(A)$, $CS_2(B)$ represent checksum values of a new data transmission event. The device identifier ID(A) of the first electronic device A can also be included in the first and/or the second checksum value $CS_1(A)$ and/or $CS_2(B)$, and the device identifier ID(B) of the second electronic device B can be included in the first and/or the second checksum value $CS_1(B)$ and/or $CS_2(B)$. The processor MCU (208) is typically arranged to determine the device identifiers ID(A) and ID(B) and the first checksum values $CS_1(A)$ and $CS_1(B)$, for example by accessing them from the memory. Further, the processor MCU (208) is typically arranged to determine also the second checksum values $CS_2(A)$ and $CS_2(B)$. The electronic devices A (200) and B (202) comprise a memory, such as a mass memory MM (210), peripheral interface circuits, an access logic and symmetrical memory components, such as NVRAM cache memory components NVC(A) (212) and NVC(B) (214). Thus, fast and robust synchronization can be achieved between the memory components NVC(A) (212) and NVC(B) (214), which makes it possible, for instance, to interrupt data transmission between the memory components and to continue it later on without the data disappearing or there being undue energy consumption.

As regards the use of the electronic device B (202) functioning as a separate storing device SD, it is preferable that a minimum amount of data is exchanged between it and the electronic device A (202), such as a mobile station, and that the data transmission is as robust and reliable as possible. This can be achieved by checking the contents of the memory components NVC(A) (212) and NVC(B) (214) with a minimum amount of data transmission in the start-up step of the wireless connection WL (206). Owing to the small amount of data transmission, the energy consumption can be reduced in the electronic devices.

Figure 3:
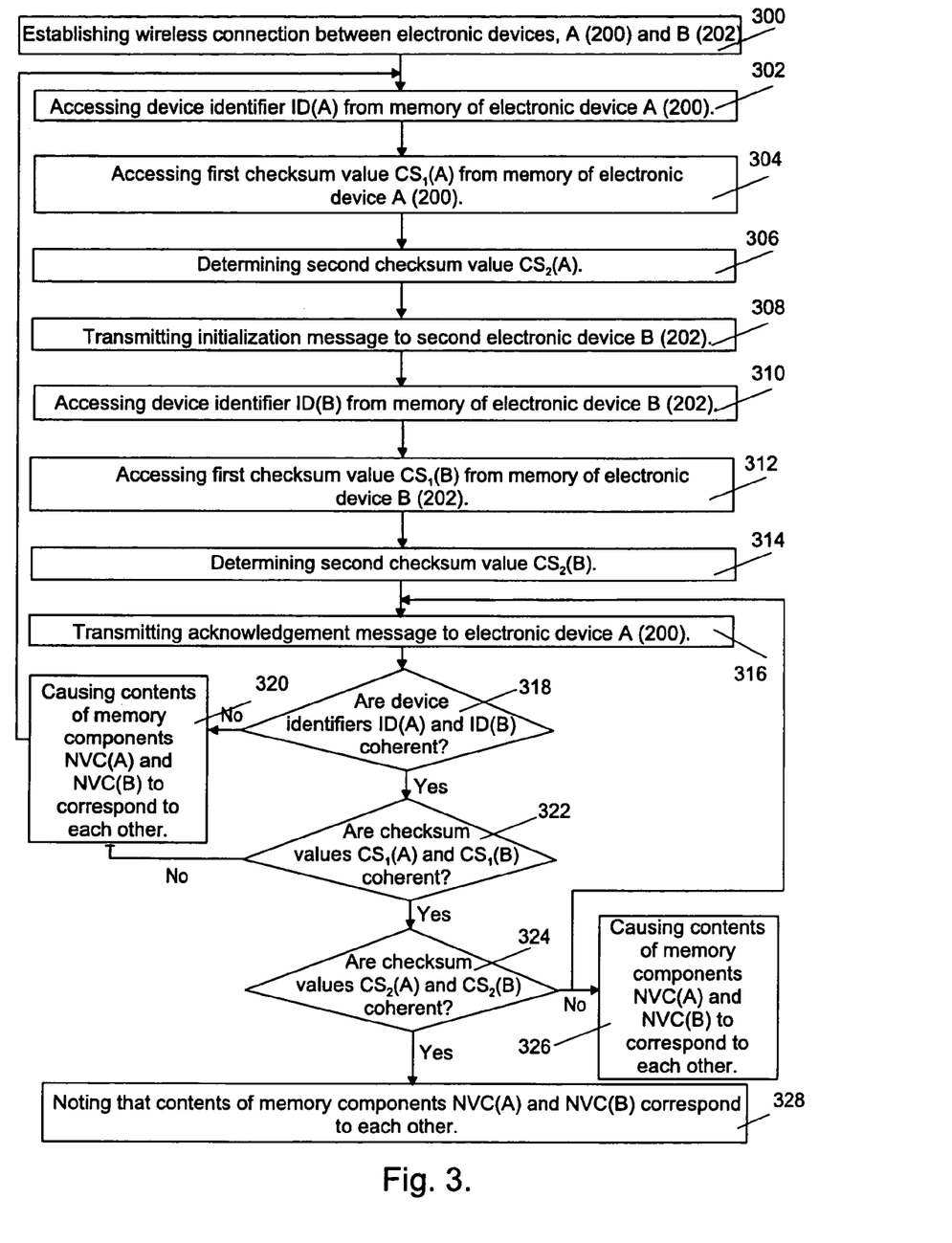
FIG. 3 shows a flow chart of comparing functionality of the memory component contents in two electronic devices.

FIG. 3, which has the same reference numerals as FIG. 2, shows a flow chart of the coherence check functionality of the contents of cache memory components, preferably NVRAM cache memory components NVC(A) (212) and NVC(B) (214). The checking is preferably performed each time in the start-up step (300) of the wireless connection WL (206). The checking is carried out with what is called a handshake procedure, in which the device identifiers ID(A), ID(B) of the first and the second electronic devices A (200), B (202) as well as the separate checksum values $CS_1$, $CS_2$ are exchanged between the first and the second electronic device A (200), B (202).

When the wireless connection WL (206) is established (300), the device identifier ID(A) (302) of the first electronic device A (200) or information for determining the device identifier ID(A), and the first checksum value $CS_1(A)$ (304) relating to the preceding, preferably confirmed data transmission event or information for determining it are accessed from the memory of the first electronic device A (200). After this, a second checksum value $CS_2(A)$ (306) is determined for a new data transmission event. The checksum values are determined for example with an algorithm, and preferably with such an algorithm that takes the continuous zero cycles into account. Further, the algorithm is preferably continuous, in which case, when there is an interruption, calculation of the checksum value can be continued later on at the point where the calculation was interrupted. Accessing the device identifier ID(A) (302) and the first checksum value $CS_1(A)$ (304) as well as determining (306) the second checksum value $CS_2(A)$ can be carried out in any order relative to each other.

The device identifier ID(A) as well as the first checksum value $CS_1(A)$ and the second checksum value $CS_2(A)$ are transmitted in an initialization message (308) to the second electronic device B (202). When the intitialization message (308) has been received, the device identifier ID(B) (310) of the second electronic device B (202) or information for determining the device identifier ID(B) and the first checksum value $CS_1(B)$ (312) relating to the preceding, preferably confirmed data transmission event are accessed from the memory of the second electronic device B (202). After this, a second checksum value $CS_2(B)$ (314) is determined for a new data transmission event. Accessing the device identifier ID(B) (310) and the first checksum value $CS_1(B)$ (312) as well as determining (314) the second checksum value $CS_2(B)$ can be carried out in any order relative to each other.

The device identifier ID(B) as well as the first checksum value $CS_1(B)$ and the second checksum value $CS_2(B)$ are transmitted in an acknowledgement message (316) to the first electronic device A (200), after which the device identifiers ID(A) and ID(B) of the first and the second electronic device A (200), B (202) are compared (318) with each other.

The contents of the NVRAM cache memory component NVC(A) (212) in the first electronic device A (200) and of the cache memory component NVC(B) (214) in the second electronic device B (202) are caused to correspond (320) to each other if the device identifiers ID(A) and ID(B) of the electronic devices A (200) and B (202) do not correspond to each other in comparison (318). This can be implemented by, for example, copying the contents of the cache memory component NVC(A) (212) partly or as a whole to the cache memory component NVC(B) (214), copying the contents of the cache memory component NVC(B) (214) partly or as a whole to the cache memory component NVC(A) (212), copying at least part of the contents of the cache memory components NVC(A) (212) and NVC(B) (214) crosswise or by clearing the contents of both cache memory components NVC(A) (212) and NVC(B) (214) partly or as a whole. Subsequently, the handshake procedure can be performed again partly or as a whole, for instance beginning from the access (302) of the device identifier ID(A).

If the first and the second device identifier ID(A) and ID(B) correspond to each other, the first checksum values $CS_1(A)$ and $CS_1(B)$ are next compared (322) with each other. The contents of the NVRAM cache memory component NVC(A) (212) in the first electronic device A (200) and in the NVRAM cache memory component NVC(B) (214) in the second electronic device B (202) are caused to correspond (320) to each other if the first checksum values $CS_1(A)$ and $CS_1(B)$ of the electronic devices A (200) and B (202) do not correspond to each other in the comparison (322). This can be implemented for instance in the way described above.

If the first checksum values $CS_1(A)$ and $CS_1(B)$ correspond to each other, the second checksum values $CS_2(A)$ and $CS_2(B)$ are compared (324) with each other. Further, the contents of the NVRAM cache memory component NVC (A) (212) in the first electronic device A (200) and the NVRAM cache memory component NVC(B) (214) in the second electronic device B (202) are caused to correspond (326) to each other, for example in the way described above or by retransmitting the acknowledgement message (316) if the second checksum values $CS_2(A)$ and $CS_2(B)$ in the electronic devices A (200) and B (202) do not correspond to each other in the comparison (324). If the acknowledgement message (316) is retransmitted, the device identifiers (318) ID(A), ID(B), the first checksum values (322) $CS_1(A)$ and $CS_1(B)$ and/or the second checksum values (324) $CS_2(A)$ and $CS_2(B)$ can be compared with each other again, on the basis of which the required further measures are taken for instance in the way described above. If the second checksum values $CS_2(A)$ and $CS_2(B)$ correspond to each other, the contents of the NVRAM cache components NVC(A) (212) and NVC(B) (214) are noted to correspond (328) to each other.

Data transmission between the electronic devices A (200) and B (202) can be implemented in several different manners. According to a preferred embodiment, no data access is used from the file system FS of the electronic device A (200) and/or B (202), but data is continuously read to a cache memory component. This embodiment is a preferred way of implementing data transmission if the cache memory component is sufficiently large to be able to store any file to be transferred. An 8-Mbyte NVRAM cache memory component, for example, is usually sufficient for almost all MP3 traffic, where the typical file size is about 3 to 6 Mbytes. In such a case, interrupting the transfer does not affect data robustness. When the contents of the NVRAM cache memory are copied to another NVRAM cache memory, the probability of data corruption is very low even if the interruption is long or one of the electronic devices A (200) and B (202) is rebooted. With volatile cache memory components, such as SRAM cache memory components, this would require re-initialization of the whole data transmission, but in the case of non-volatile cache memory components, such as NVRAM cache memory components NVC(A) (212) and NVC (B) (214), only minor checks mentioned above are required in order to ensure that the NVRAM cache memory components NVC(A) (212) and NVC(B) (214) are not corrupted. Preferably, the storing capacities of the NVRAM cache memory components NVC (A) and NVC(B) are larger than the size of the largest file.

In a second preferred embodiment, data is accessed in such a way that each piece of accessed data fits into the NVRAM cache memory component NVC(A) (212) and/or NVC(B) (214) or into that part of the NVRAM cache memory which is intended for data transmission.

In a third preferred embodiment, data is accessed within the permanent file system FS. The files to be transferred are preferably divided into pieces which can be transferred one by one. If protected during the data transmission, the files in the permanent file system FS do not have to be checked when the data transmission is interrupted. The protection can generally be carried out for example by locking the file, or preferably by creating for the file in the file system FS what is called a mirror version, which is transferred access by access.

Figure 4:
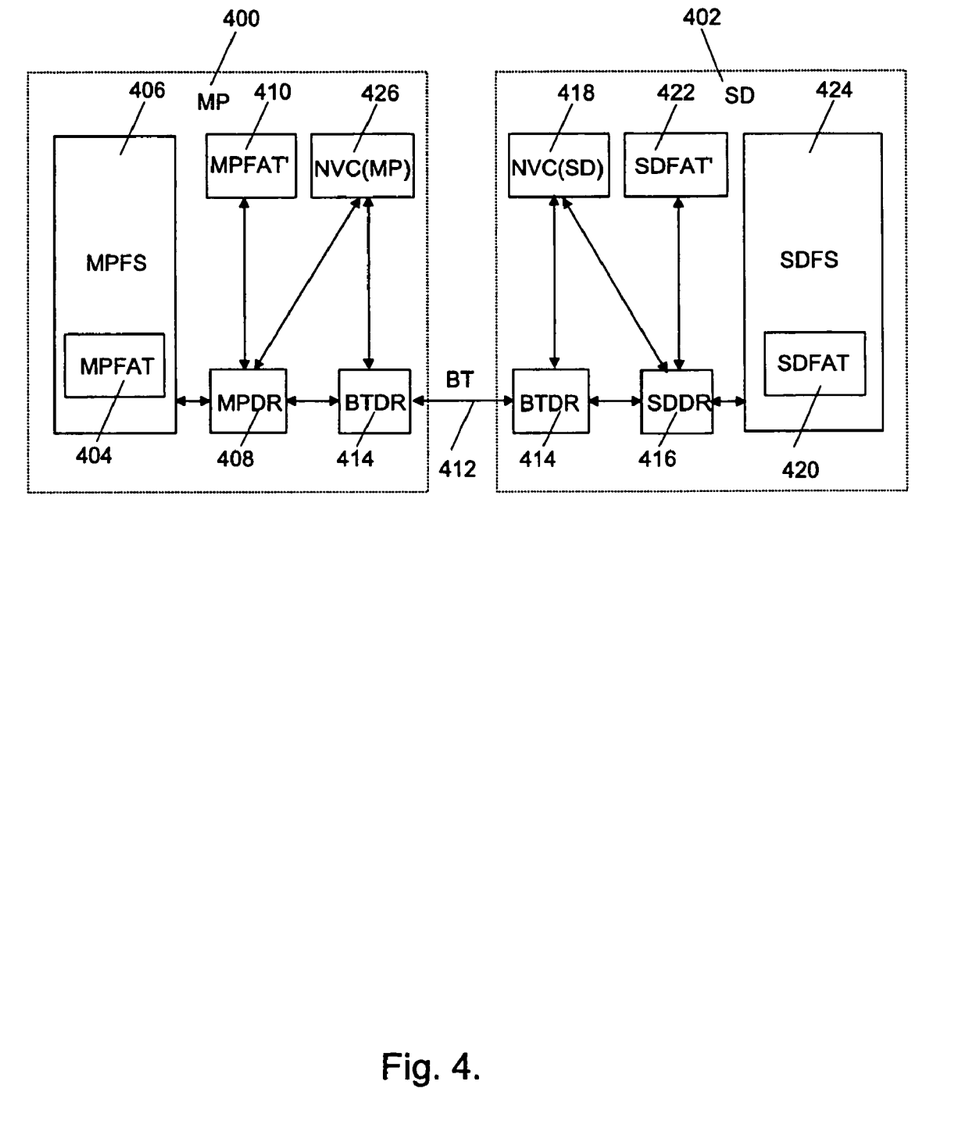
FIG. 4 shows an algorithm for reading a file in an external storing device.

FIG. 4 shows a sample algorithm for reading a file in an external storing device SD (402). The functionality of the algorithm can also be extended to writing in a mass memory or to any one-way data transfer. The algorithm can also have preferred embodiments other than the ones presented here. The following algorithms are independent of the embodiments of the file allocation table FAT. In a preferred embodiment, the file allocation tables FAT are stored in NVRAM cache memory components, in which case the synchronization is simpler and more robust.

Reading the file in the external storing device SD (402) can be performed for instance in the following manner. First, an access request is transmitted from the file system MPFS (406) of an electronic device, such as a mobile station MP (400), comprising a file allocation table MPFAT (404) to the driver MPDR (408) of the mobile station MP (400). The mirror version MPFAT' (410) of the file allocation table MPFAT (404) is checked in order to see the length FR of the file and the pointer FR' in the memory space. Pointer F0' and area F0=FR is allocated from the file system MPFS (406) of the mobile station MP (400). The access request is transmitted to a driver BTDR (414) via a wireless connection, such as a Bluetooth connection BT (412). For instance the Bluetooth connection BT (412) is started and initialized between the mobile station (400) and the external storing device SD (402). It is checked with the handshake procedure presented above whether the contents of the mirror version MPFAT' (410) of the file allocation table and the real file allocation table MPFAT (404) are coherent.

If the mirror version MPFAT' (410) and the real version MPFAT (404) of the file allocation table of the mobile station MP (400) are not coherent, the file allocation table MPFAT (404) is synchronized. The mirror version SDFAT' (422) of the file allocation table MPFAT (404) is checked in order to see the length of the file and the pointer in the memory space. The pointer XM' of the NVRAM cache memory component NVC(SD) (418) is allocated in the driver SDDR (416) of the storing device SD (402). The file allocation table SDFAT (420) is copied to the NVRAM cache memory component NVC(SD) (418) of the storing device SD (402), beginning from the pointer XM'. The pointer XM' is transmitted to the driver MPDR (408) of the mobile station MP (400) via the Bluetooth connection BT (412). The pointer XT' is allocated in the NVRAM cache memory component NVC(MP) (426) of the mobile station MP (400). Generally, XT'=XM'. The contents of the NVRAM cache memory component NVC(SD) (418) of the storing device SD (402) are transmitted to the NVRAM cache memory component NVC(MP) (426) of the mobile station MP (400). It is checked whether the transfer was successful by means of the above-described handshake procedure, for example. If the transfer was successful, the contents of the NVRAM cache memory component NVC (MP) (426) are copied to the mirror version MPFAT' (410) of the file allocation table.

Copying the NVRAM cache memory component NVC (MP) (426) can be carried out in the following manner, for example. A "Read F0" command is transmitted from the driver MPDR (408) of the mobile station MP (400) to the driver SDDR (416) of the storing device SD (402). A pointer YM' is allocated from the NVRAM cache memory component NVC(SD) (418) of the storing device SD (402) and a pointer YT' from the NVRAM cache memory component NVC(MP) (426) of the mobile station MP (400). Generally, XT'=XM'. The contents of the file are copied from the file system SDFS (424) of the storing device SD (402) to the NVRAM cache memory component NVC(SD) (418) of the storing device SD (402), beginning from the pointer YM'. If the length of the file is greater than the size NVS of the NVRAM cache memory component NVC(MP) (426), only NVS bits are copied at a time and synchronized. Preferably, it can be assumed that the data is accessed in such a way that the access always fits into the NVRAM cache memory component. Thus, no module arithmetics are needed. This requires, however, that the size of the NVRAM cache memory component be determined sufficiently large to cover possible cases of copying.

The copying can typically be started from the first memory location of each of the cache memory components, but preferably the copying is started from any memory location by using modulo algebra as follows:

$$Y = (A+X) \bmod NVS$$

where
Y=new physical address location;
A=physical address from which writing is started
X=number of written logical address locations
NVS=size of NVRAM cache memory component Good writing efficiency can be achieved with the modulo algebra presented, because the new file can typically be written immediately after the preceding file and the modulo arithmetics are responsible for logical transfer of address locations. Applying modulo arithmetics allows several files to be written in the NVRAM cache memory component at a time at the external maximum rate of the terminal and synchronization to be performed for instance over the air interface. An advantage of this embodiment is that the memories in the terminal are not to a great extent bound to the air interface, so that the air interface can in some cases be hidden from the applications, which improves the generality and reusability of the application.

The contents of the NVRAM cache memory component NVC(SD) (418) can be copied to the file system MPFS (406) of the mobile station (400). Device identifiers ID(A) and ID(B) as well as checksum values $CS_1$ and $CS_2$ or corresponding values are used to check in the above-described manner whether the version of the file system MPFS (406) is the same as in the storing device SD (402). If the contents of the file systems MPFS (406) and SDFS (424) are coherent, the file allocation table MPFAT (404) of the mobile station (400) is updated. A confirmation of successful update is transmitted to the storing device SD (402) via a wireless connection, such as a Bluetooth connection BT (412).

If the data transmission is interrupted at some stage, the data transmission event can be continued for instance from the copying of file contents from the file system SDFS (424) of the storing device SD (402) to the NVRAM cache memory component NVC(SD) (418) of the storing device SD (402) when it has been checked that the file allocation tables SDFAT (420) and SDFAT' (422) are still synchronized, in other words that they are still in synchronization with each other. In the case of the file allocation tables MPFAT (404) and SDFAT (420) of symmetric NVRAM cache memory components NVC(MP) (422) and NVC(SD) (418), there is no need, at least in theory, to check the file systems MPFS (406) and SDFS (424). Typically, only an NVRAM-NVRAM connection is required if the NVRAM cache memory components NVC(MP) (422) and NVC(SD) (418) are large enough to store the whole file to be transferred. Partial checking may be needed for the accessed files.

In some cases, it may be preferable for several files to be interleaved in one direction, in which case they may have been transmitted at different speeds, depending on their urgency. This is possible because the wireless data transmission rate is relatively slow.

Reading and writing in one direction can be performed in a plurality of ways. Generally, the easiest way is to separate the cache memory components into two or more parts, using them as two separate cache memory components, for example. If their lengths are NVS1 and NVS2, modulo-NVS1 and modulo-NVS2 algebra is used for each part. The file allocation tables FAT are only updated when the files have been completely and correctly copied.

Reading and writing can also be performed in the following manner. In order for the synchronization of the file allocation tables FAT to be successful, it is required that the synchronization have priority over all other operations. For instance, read and write operations are typically interrupted when the file allocation table FAT is synchronized.

Reading and writing can also be performed in two directions. This makes the keeping of the file allocation tables FAT synchronized somewhat more complicated. However, this can be avoided in the manner described earlier.

Reading and writing can also be performed in several directions. For instance Bluetooth and some other protocols enable what is called multipoint operation. This means, for example, copying of files from several storing devices SD at one time. This makes the keeping of the file allocation tables FAT synchronized significantly more complicated. However, this can be avoided in the manner described earlier.

Figure 5:
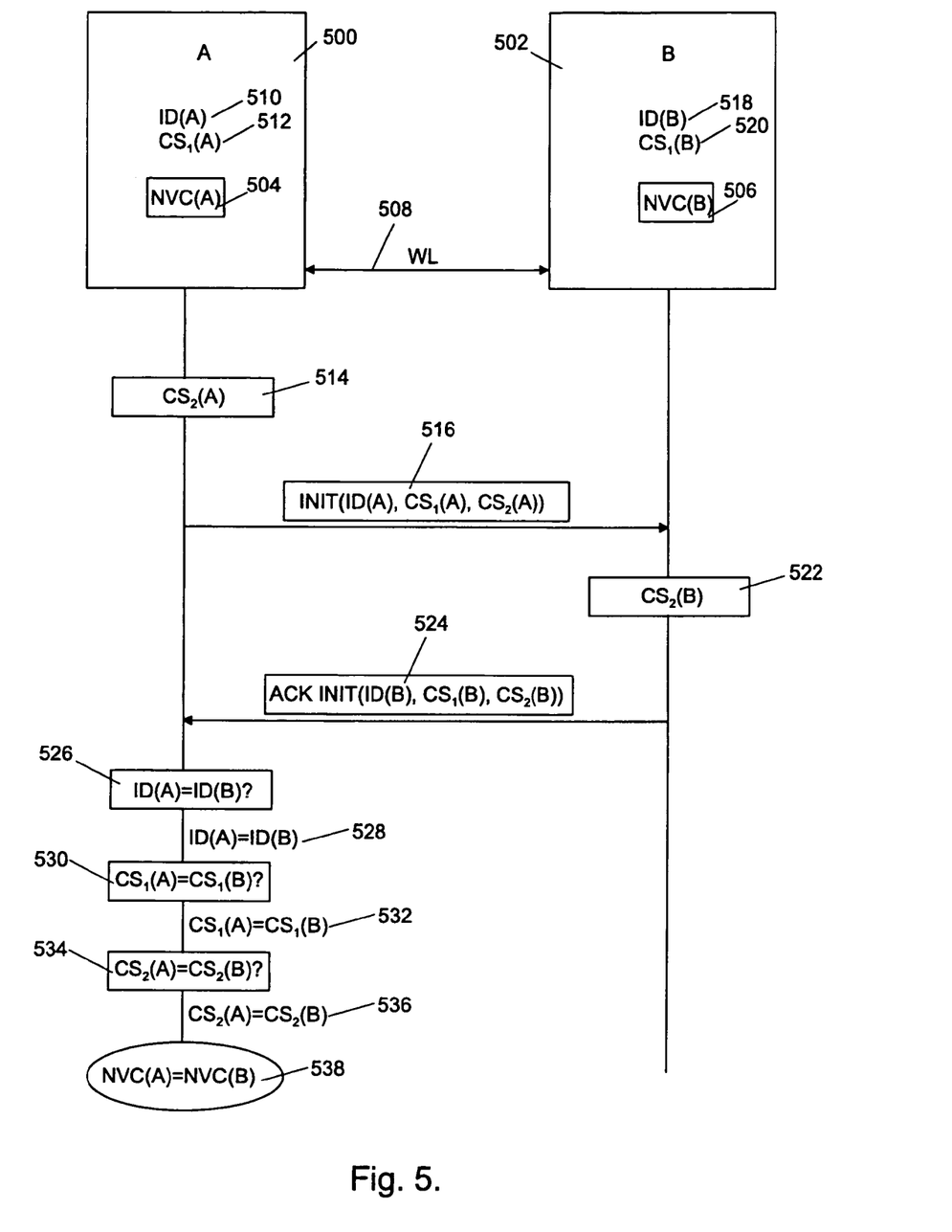
FIG. 5 shows data transmission according to an embodiment of the invention between two electronic devices for comparing the memory component contents in the electronic devices.

According to FIG. 5, the comparison method for comparing the contents of memory components NVC(A) (504) and NVC(B) (506) according to the invention can be implemented with a preferred embodiment of the comparison system according to the invention. A first electronic device A (500) and a second electronic device B (502) in the system are arranged to establish a wireless connection WL (508) to each other. The first electronic device A (500) is arranged to access from the memory its own device identifier ID(A) (510) or information for determining it, and a first checksum value $CS_1(A)$ (512) relating to the preceding, preferably confirmed data transmission event or information for determining it. After this, the first electronic device A (500) is arranged to determine a second checksum value $CS_2(A)$ (514) for a new data transmission event or information for determining it. Accessing the device identifier ID(A) (510) and the first checksum value $CS_1(A)$ (512) and determining the second checksum value $CS_2(A)$ (514) can be performed in any order relative to each other. After this, the first electronic device A (500) is arranged to transmit its own device identifier ID(A) (510) as well as the first checksum value $CS_1(A)$ (512) and the second checksum value $CS_2(A)$ (514) or information for determining them to the second electronic device B (502) in an initialization message INIT (512).

The second electronic device B (502) is arranged to receive the initialization message INIT (516) transmitted by the first electronic device A (500) and to access from the memory a device identifier ID(B) (518) or information for determining it, and a checksum value $CS_1(B)$ (520) relating to the preceding, preferably confirmed data transmission event or information for determining it. After this, the second electronic device B (502) is arranged to determine a second checksum value $CS_2(B)$ (522) for a new data transmission event. Accessing of the device identifier ID(B)

(518) and the first checksum value $CS_1(B)$ (520) as well as determining the second checksum value $CS_2(B)$ (522) can be performed in any order relative to each other. Subsequently, the second electronic device B (502) is arranged to transmit the device identifier ID(B) (418) as well as the first and the second checksum value $CS_1(B)$ (520) and $CS_2(B)$ (522) or information for determining it to the first electronic device A (500) in an acknowledgement message ACK INIT (524). The first electronic device (500) is arranged to receive an acknowledgement message ACK INIT (524).

The first electronic device A (500) is arranged to compare (526) the device identifiers ID(A) (510) and ID(B) (518) of the first electronic device A (500) and the second electronic device B (502). The first and/or the second electronic device A (500) and/or B (502) is/are arranged to cause the contents of the cache memory component NVC(A) (504) in the electronic device A (500) and the cache memory component NVC(B) (506) in the second electronic device B (502) to correspond to each other in the above-described manner if the device identifiers ID(A) (510) and ID(B) (518) of the first and the second electronic device A (500) and B (502) do not correspond to each other in the comparison (526).

If the device identifiers ID(A) (510) and ID(B) (518) correspond (528) to each other, the first electronic device A (500) is arranged to compare (530) the first checksum values $CS_1(A)$ (512) and $CS_1(B)$ (520) with each other. The first and/or the second electronic device A (500) and/or B (502) is/are arranged to cause the contents of the cache memory component NVC(A) (504) in the electronic device (A) (500) and the cache memory component NVC(B) (506) in the second electronic device B (502) to correspond to each other in the above-described manner if the fist checksum values $CS_1(A)$ and $CS_1(B)$ of the first electronic device A (500) and the second electronic device B (502) do not correspond to each other in the comparison.

If the first checksum values $CS_1(A)$ and $CS_1(B)$ correspond (532) to each other, the first electronic device A (500) is arranged to compare (534) the second checksum values $CS_2(A)$ and $CS_2(B)$ with each other. The first and/or the second electronic device A (500) and/or B (502) is/are arranged to cause the contents of the cache memory component NVC(A) (504) in the electronic device A (500) and the cache memory component NVC(B) (506) of the second electronic device B (502) to correspond to each other, or alternatively, the second electronic device B (502) is arranged to retransmit an acknowledgement message ACK INIT (524) to the first electronic device A (500) if the second checksum values $CS_2(A)$ and $CS_2(B)$ of the first and the second electronic device A (500) and B (502) do not correspond to each other in the comparison. If the second electronic device B (502) retransmits an acknowledgement ACK INIT (524), the first electronic device A (500) is arranged to re-compare the device identifiers ID(A), ID(B), the first checksum values $CS_1(A)$, $CS_1(B)$ and/or the second checksum values $CS_2(A)$ and $CS_2(B)$, on the basis of which the further measures are taken, for instance in the above-described manner. If the second checksum values $CS_2(A)$ and $CS_2(B)$ correspond (536) to each other, the first and/or the second electronic device A (500) and B (502) is/are arranged to note that the contents of the cache memory components NVC(A) (504) and NVC(B) (506) correspond (538) to each other.

In the above, a comparison method and system for comparing contents of memory components have been described. The comparing functionality can preferably be achieved with a software product arrangeable in an electronic device, comprising a software code for determining a device identifier ID(A) used for identifying a first electronic device A, a first checksum value $CS_1(A)$ relating to an earlier data transmission event and a second checksum value $CS_2(A)$ relating to a second data transmission event, for receiving the device identifier ID(B) of the second electronic device B as well as the first and the second checksum value $CS_1(B)$, $CS_2(B)$ or information used for determining them, for comparing the device identifiers ID(A), ID(B) of the first and the second electronic devices A, B, the first checksum values $CS_1(A)$, $CS_1(B)$ and the second checksum values $CS_2(A)$, $CS_2(B)$ with each other, for updating the contents of the memory component NVC(A) to correspond to the contents of the memory component in the second electronic device B if the device identifiers ID(A) and ID(B), the first checksum values $CS_1(A)$, $CS_1(B)$ or the second checksum values $CS_2(A)$, $CS_2(B)$ do not correspond to each other, and for noting the correspondence between the contents of the memory component NVC(A) of the first electronic device A and the contents of the memory component NVC(B) of the second electronic device B if the device identifiers ID(A), ID(B), the first checksum values $CS_1(A)$, $CS_1(B)$ and the second checksum values $CS_2(A)$, $CS_2(B)$ do correspond to each other.

It will be obvious to a person skilled in the art that as the technology advances, the basic idea of the invention can be implemented in a plurality of ways. For example, the contents of the cache memory components NVC(A) and NVC(B) can be made coherent also in a manner other than the one described here. The invention and its embodiments are thus not confined to the above-described examples, but can vary within the scope of the claims.

The invention claimed is:

1. A method for comparing contents of physical memory components comprised by a first and a second electronic device, the electronic devices being configured to establish a data transmission connection between each other, comprising:
   determining first checksum values relating to a first data transmission event and second checksum values relating to a second data transmission event, wherein the contents of the first and the second checksum values are derived from or they describe the contents of the physical memory components;
   transmitting from the first electronic device to the second electronic device where at least one of the first and second electronic devices is a mobile device, an initialization message comprising at least the first checksum value and the second checksum value or information for determining them; and
   comparing the first checksum values and the second checksum values with each other, as a result of which:
   the contents of the physical memory components are caused to correspond to each other as a response to the first checksum values or the second checksum values not corresponding to each other.

2. A method according to claim 1, further comprising:
   noting that the contents of the memory components correspond to each other as a response to the first checksum values and the second checksum values corresponding to each other.

3. A method according to claim 1, further comprising:
   said first and/or second checksum value comprising a device identifier.

4. A method according to claim 1, further comprising:
   determining the first checksum values by accessing them or information for determining them from the memory of the electronic device.

5. A method according to claim 1, further comprising:
determining the first and the second checksum value as a response to the second electronic device having received said initialization message.

6. A method according to claim 1, further comprising:
transmitting from the second electronic device to the first electronic device an acknowledgement message comprising at least the first and the second checksum value or information for determining them as a response to the first and the second checksum value having been determined.

7. A method according to claim 1, further comprising:
comparing the first checksum values, as a result of which:
the contents of said memory components are caused to correspond to each other as a response to said first checksum values not corresponding to each other.

8. A method according to claim 1, further comprising:
comparing the second checksum values as a response to said first checksum values corresponding to each other, as a result of which:
the contents of the memory components are caused to correspond to each other as a response to the second checksum values not corresponding to each other.

9. A method according to claim 6, further comprising:
comparing the second checksum values as a response to the first checksum values corresponding to each other, as a result of which:
said acknowledgement message is retransmitted as a response to the second checksum values not corresponding to each other.

10. A system comprising at least the first and the second electronic device, the electronic devices comprising physical memory components, and means for establishing a data transmission connection between the first electronic device and the second electronic device, wherein
at least one of the first and the second electronic devices is a mobile device and the first and second devices are configured to determine the first checksum values relating to an earlier data transmission event and second checksum values relating to a second data transmission event, wherein the contents of the first and the second checksum values are derived from or they describe the contents of the physical memory components;
the first electronic device is configured to transmit to the second electronic device an initialization message comprising at least the first and the second checksum value or information for determining them; and
the first and/or the second electronic device is/are configured to compare the first checksum values and the second checksum values, as a result of which:
the first and/or the second electronic device is/are configured to cause the contents of the physical memory components to correspond to each other as a response to the first checksum values, or the second checksum values not corresponding to each other.

11. A system according to claim 10, wherein
the first and/or the second electronic device is/are configured to note that the contents of the memory components correspond to each other as a response to the first checksum values and the second checksum values, corresponding to each other.

12. A system according to claim 10, wherein
said first and/or the second checksum value comprises a device identifier.

13. An electronic mobile device comprising a physical memory component and means for establishing a data transmission connection to a second electronic device, wherein said electronic device comprises:
means for determining a first checksum value relating to a first data transmission event and a second checksum value relating to a second data transmission event, wherein the contents of the first and second checksum values are derived from or they describe the contents of the physical memory components;
means for receiving a first and a second checksum value or information for determining them;
means for comparing the first checksum values and the second checksum values with each other; and
means for updating the contents of the physical memory component to correspond to the contents of the physical memory component of the second electronic device as a response to the first checksum values and the second checksum values not corresponding to each other.

14. An electronic device according to claim 13, wherein said electronic device further comprises:
means for noting the correspondence between the contents of the memory component of said electronic device and the contents of the memory component of said second electronic device as a response to the first checksum values and the second checksum values corresponding to each other.

15. An electronic device according to claim 13, wherein said electronic device further comprises:
means for determining the first checksum value by accessing it or information for determining it from the memory of said electronic device.

16. A computer-readable medium, wherein said computer-readable medium comprises computer-executable instructions for causing a telecommunications device to:
determine first checksum values relating to a first data transmission event and second checksum values relating to a second data transmission event, wherein the contents of the first and second checksum values are derived from or they describe the contents of physical memory components of a first and a second electronic device, where at least one of the first and second electronic devices is a mobile device;
transmit from the first electronic device to the second electronic device an initialization message comprising at least the first checksum value and the second checksum value or information for determining them; and
compare the first checksum values and the second checksum values with each other, as a result of which:
the contents of the physical memory components are caused to correspond to each other as a response to the first checksum values or the second checksum values not corresponding to each other.

17. A computer-readable medium according to claim 16, wherein the computer-readable medium further comprises computer-executable instructions for causing the telecommunications device to note
the correspondence between the contents of the memory component of said first electronic device and the contents of the memory component of said second electronic device as a response to the first checksum values and the second checksum values corresponding to each other.

18. An electronic mobile device having a physical memory component and means for establishing a data transmission connection to a first electronic device, wherein said electronic device comprises:
means for determining a first checksum value relating to a first data transmission event and a second checksum value relating to a second data transmission event, wherein the contents of the first and the second checksum values are derived from or they describe the contents of the physical memory component; and means for sending a first and a second checksum value or information for determining them for comparing them with each other and updating the contents of the physical memory component to correspond to the contents of the memory component of the first electronic device as a response to the first checksum values and the second checksum values not corresponding to each other.

* * * * *

UNITED STATES PATENT AND TRADEMARK OFFICE
CERTIFICATE OF CORRECTION

| | |
|---|---|
| PATENT NO. | : 7,302,529 B2 |
| APPLICATION NO. | : 10/747779 |
| DATED | : November 27, 2007 |
| INVENTOR(S) | : Jakke Mäkelä, Jukka-Pekka Vihmalo and Marko T. Ahvenainen |

It is certified that error appears in the above-identified patent and that said Letters Patent is hereby corrected as shown below:

<u>In the Claims</u>

Claim 1, column 12, line 45: "device where" should be --device, where--.

Claim 10, column 13, line 49: "andior" should be --and/or--.

Signed and Sealed this

Sixth Day of May, 2008

JON W. DUDAS
*Director of the United States Patent and Trademark Office*